US009344103B1

(12) United States Patent
Lin

(10) Patent No.: US 9,344,103 B1

(45) Date of Patent: May 17, 2016

(54) HIGH-RESOLUTION TIME-TO-DIGITAL CONVERTER AND METHOD THEREOF

(71) Applicant: REALTEK SEMICONDUCTOR CORPORATION, Hsinchu (TW)

(72) Inventor: Chia-Liang (Leon) Lin, Fremont, CA (US)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 14/854,495

(22) Filed: Sep. 15, 2015

Related U.S. Application Data

(63) Continuation-in-part of application No. 14/804,582, filed on Jul. 21, 2015.

(51) Int. Cl.
*H03M 1/50* (2006.01)
*H03M 1/06* (2006.01)
*G04F 10/00* (2006.01)

(52) U.S. Cl.
CPC ........... *H03M 1/0626* (2013.01); *G04F 10/005* (2013.01)

(58) Field of Classification Search
CPC ....... H03M 1/0626; H03M 1/50; H03M 1/60; H03M 1/82; G04F 10/005
USPC .................................................. 341/155, 166
See application file for complete search history.

(56) References Cited

U.S. PATENT DOCUMENTS 8,064,561 B2 * 11/2011 Henzler ........... G01R 31/31709 375/371
8,957,712 B2 * 2/2015 Tang ..................... H03L 7/0991 327/141
2015/0070949 A1 * 3/2015 Mukhopadhyay ....... H04Q 9/00 363/48

* cited by examiner

*Primary Examiner* — Khai M Nguyen
(74) *Attorney, Agent, or Firm* — Sughrue Mion, PLLC

(57) ABSTRACT

A circuit includes: a rectifier configured to receive a first clock signal and a second clock signal and output a rectified signal, wherein the second clock signal is the same as the first clock signal except for an offset in timing; a low-pass filter configured to receive the rectified signal and output a filtered signal; and an analog-to-digital converter configured to convert the filtered signal into a digital signal.

20 Claims, 6 Drawing Sheets

HIGH-RESOLUTION TIME-TO-DIGITAL CONVERTER AND METHOD THEREOF

CROSS-REFERENCE

This application is a continuation-in-part of U.S. application Ser. No. 14/804,582, filed Jul. 21, 2015, which is incorporated herein by reference in its entirety.

BACKGROUND OF THE INVENTION

1. Field of the Invention

The present invention generally relates to a time-to-digital converter.

2. Description of Related Art

Persons of ordinary skill in the art understand terms and basic concepts related to microelectronics that are used in this disclosure, such as "voltage," "signal," "logical signal," "clock," "phase," "period," "trip point," "resistor," "capacitor," "transistor," "MOS (metal-oxide semiconductor)," "PMOS (p-channel metal oxide semiconductor)," "NMOS (n-channel metal oxide semiconductor)," "source," "gate," "drain," "rectifier," "half-wave rectifier," "full-wave rectifier," and "analog-to-digital converter." Terms and basic concepts like these are apparent to those of ordinary skill in the art and thus will not be explained in detail here.

Through this disclosure, a logical signal is a signal of two states: "high" and "low," which can also be re-phrased as "1" and "0." For brevity, a logical signal in the "high" ("low") state is simply stated as the logical signal is "high" ("low"), or alternatively, the logical signal is "1" ("0"). Also, for brevity, quotation marks may be omitted and the immediately above is simply stated as the logical signal is high (low), or alternatively, the logical signal is 1 (0), with the understanding that the statement is made in the context of describing a state of the logical signal.

A logical signal is said to be asserted when it is high. A logical signal is said to be de-asserted when it is low.

A clock signal is a periodic logical signal of a period. For brevity, hereafter, "clock signal" may be simply referred to as "clock."

A time-to-digital converter receives a first clock and a second clock and outputs a digital code representing a timing difference between the first clock and the second clock. Time-to-digital converters are well known in the prior art and thus not described in detail here.

A self-calibrating multi-phase clock circuit disclosed in a co-pending application titled "Self-Calibrating Multi-Phase Clock Circuit and Method Thereof" uses a time-to-digital converter to perform calibration on a multi-phase clock. Generally, calibration will not be very accurate unless the time-to-digital converter has a high resolution. Besides, if the multi-phase clock is of a high frequency, the time-to-digital converter needs to be able to resolve a timing of a high-frequency clock. It is very difficult to design a time-to-digital converter capable of resolving a timing of a high frequency clock with a high resolution. For instance, it is very difficult to resolve a timing for a multi-phase 25 GHz clock with a resolution as fine as 1 ps.

What is desired is a time-to-digital converter capable of resolving a timing of a high frequency clock with a high resolution.

BRIEF SUMMARY OF THIS INVENTION

An aspect according to the exemplary embodiment is to use a rectifier to transform a timing offset of a clock signal into a rectified signal, filter the rectified signal into a filtered signal, and then convert the filtered signal into a digital code to represent the timing offset.

An aspect according to the exemplary embodiment is to use a transmission gate as a rectifier to transform a timing offset of a clock signal into a rectified signal, filter the rectified signal into a filtered signal, and then convert the filtered signal into a digital code to represent the timing offset.

In the exemplary embodiment, a circuit includes: a rectifier configured to receive a first clock signal and a second clock signal and output a rectified signal, wherein the second clock signal is the same as the first clock signal except for an offset in timing; a low-pass filter configured to receive the rectified signal and output a filtered signal; and an analog-to-digital converter configured to convert the filtered signal into a digital signal. In the exemplary embodiment, the rectifier includes a first half-wave rectifier including: a transmission gate of a first type configured to pass the first clock signal to a first end of the rectified signal in accordance with the second clock signal. In the exemplary embodiment, the transmission gate of the first type includes: a MOS (metal-oxide semiconductor) transistor of a first type, wherein a source, a gate, and a drain of the MOS transistor of the first type couple to the first clock signal, the second clock signal, and the first end of the rectified signal, respectively. In the exemplary embodiment, the transmission gate of the first type further includes: a MOS transistor of a second type, wherein a source, a gate, and a drain of the MOS transistor of the second type couple to the second clock signal, the second clock signal, and the first end of the rectified signal, respectively. In the exemplary embodiment, the first half-wave rectifier further includes: a transmission gate of a second type configured to pass the second clock signal to a second end of the rectified signal in accordance with the first clock signal. In the exemplary embodiment, the transmission gate of the second type includes: a MOS transistor of the second type, wherein a source, a gate, and a drain of the MOS transistor of the second type couple to the second clock signal, the first clock signal, and the second end of the rectified signal, respectively. In the exemplary embodiment, the transmission gate of the second type further includes: a MOS transistor of the first type, wherein a source, a gate, and a drain of the MOS transistor of the first type couple to the first clock signal, the first clock signal, and the second end of the rectified signal, respectively. In the exemplary embodiment, the rectifier further includes a second half-wave rectifier, wherein the second half-wave rectifier is the same as the first half-wave rectifier except that the roles of the first clock signal and the second clock signal are swapped. In the exemplary embodiment, the low-pass filter includes a shunt capacitor. In the exemplary embodiment, the low-pass filter further includes a serial resistor.

In the exemplary embodiment, a method includes: receiving a first clock signal and a second clock signal, wherein the second clock signal is the same as the first clock signal except for a timing offset; rectifying a difference between the first clock signal and the second clock signal into a rectified signal using a rectifier; filtering the rectified signal into a filtered signal using a low-pass filter; and converting the filtered signal into a digital signal using an analog-to-digital converter. In the exemplary embodiment, the rectifier includes a first half-wave rectifier including: a transmission gate of a first type configured to pass the first clock signal to a first end of the rectified signal in accordance with the second clock signal. In the exemplary embodiment, the transmission gate of the first type includes: a MOS (metal-oxide semiconductor) transistor of a first type, wherein a source, a gate, and a drain of the MOS transistor of the first type couple to the first clock signal, the second clock signal, and the first end of the rectified signal, respectively. In the exemplary embodiment, the transmission gate of the first type further includes: a MOS transistor of a second type, wherein a source, a gate, and a drain of the MOS transistor of the second type couple to the second clock signal, the second clock signal, and the first end of the rectified signal, respectively. In the exemplary embodiment, the first half-wave rectifier further includes: a transmission gate of a second type configured to pass the second clock signal to a second end of the rectified signal in accordance with the first clock signal. In the exemplary embodiment, the transmission gate of the second type includes: a MOS transistor of the second type, wherein a source, a gate, and a drain couple of the MOS transistor of the second type couple to the second clock signal, the first clock signal, and the second end of the rectified signal, respectively. In the exemplary embodiment, the transmission gate of the second type further includes: a MOS transistor of the first type, wherein a source, a gate, and a drain of the MOS transistor of the first type couple to the first clock signal, the first clock signal, and the second end of the rectified signal, respectively. In the exemplary embodiment, the rectifier further includes a second half-wave rectifier, wherein the second half-wave rectifier is the same as the first half-wave rectifier except that the roles of the first clock signal and the second clock signal are swapped. In the exemplary embodiment, the low-pass filter includes a shunt capacitor. In the exemplary embodiment, the low-pass filter further includes a serial resistor.

DETAILED DESCRIPTION OF THIS INVENTION

The present invention relates to time-to-digital converter. While the specification describes several exemplary embodiments of the invention considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the invention.

The present disclosure is presented from an engineering viewpoint, wherein a first quantity is said to be "equal to" a second quantity if a difference between the first quantity and the second quantity is smaller than a given tolerance. For instance, 100.2 mV is said to be equal to 100 mV if the given tolerance is 0.5 mV. Likewise, when it is stated: "A is the same as B," it means: "there is no substantial difference between A and B, as far as practical engineering considerations are concerned."

Figure 1A:
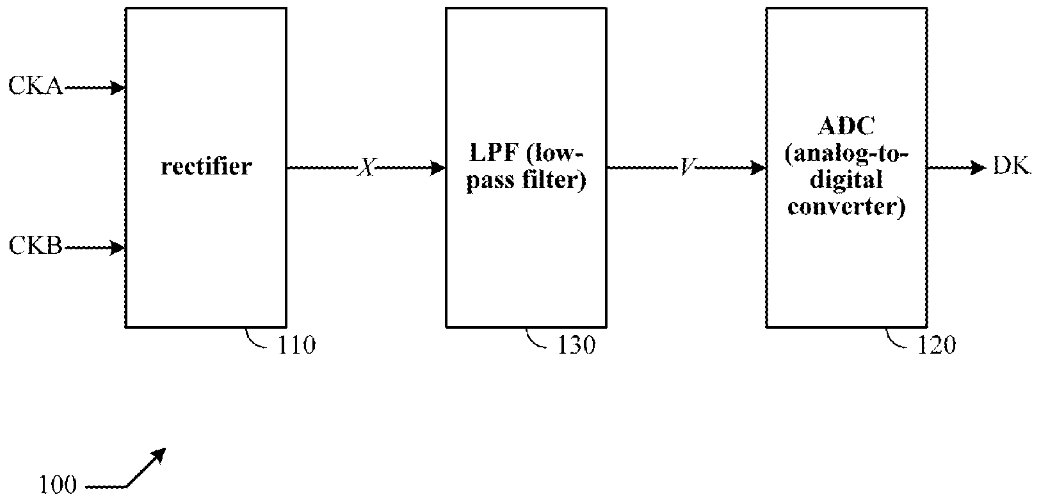
FIG. 1A shows a functional block diagram of time-to-digital converter in accordance with the exemplary embodiment.

FIG. 1A shows a functional block diagram of a TDC (time-to-digital converter) 100 in accordance with the exemplary embodiment. The TDC 100 includes: a rectifier 110 configured to receive a first clock signal CKA and a second clock signal CKB and output a rectified signal X; a LPF (low-pass filter) 130 configured to receive the rectified signal X and output a filtered signal V; and an ADC (analog-to-digital converter) 120 configured to convert the filtered signal V into a digital signal DK. For brevity, hereafter, the first clock signal CKA is simply referred to as CKA, the second clock signal CKB is simply referred to as CKB, the rectified signal X is simply referred to as X, the filtered signal V is simply referred to as V, and the digital signal DK is simply referred to as DK. Here, CKA and CKB are the same clock except for a timing offset. Let a clock period of CKA be $T_{CK}$. Let the timing offset be $T_{OS}$. A function of the TDC 100 is to resolve the timing offset $T_{OS}$ and represent it by DK. The rectifier 110 along with the LPF 130 transforms the timing offset $T_{OS}$ into V, such that V effectively represents $T_{OS}$. The ADC 120 then converts V into DK, so that DK effectively represents $T_{OS}$, thus fulfilling a function of time-to-digital conversion. Even though CKA and CKB may be of a high frequency, the timing offset $T_{OS}$ is nearly a fixed offset. As a result, V is a slowly-changing signal that can be effectively processed by ADC 120 with a high resolution. Therefore, as long as the rectifier 110 and the LPF 130 can properly transform the timing offset $T_{OS}$ into V, $T_{OS}$ can be resolved with a high resolution.

Figure 1B:
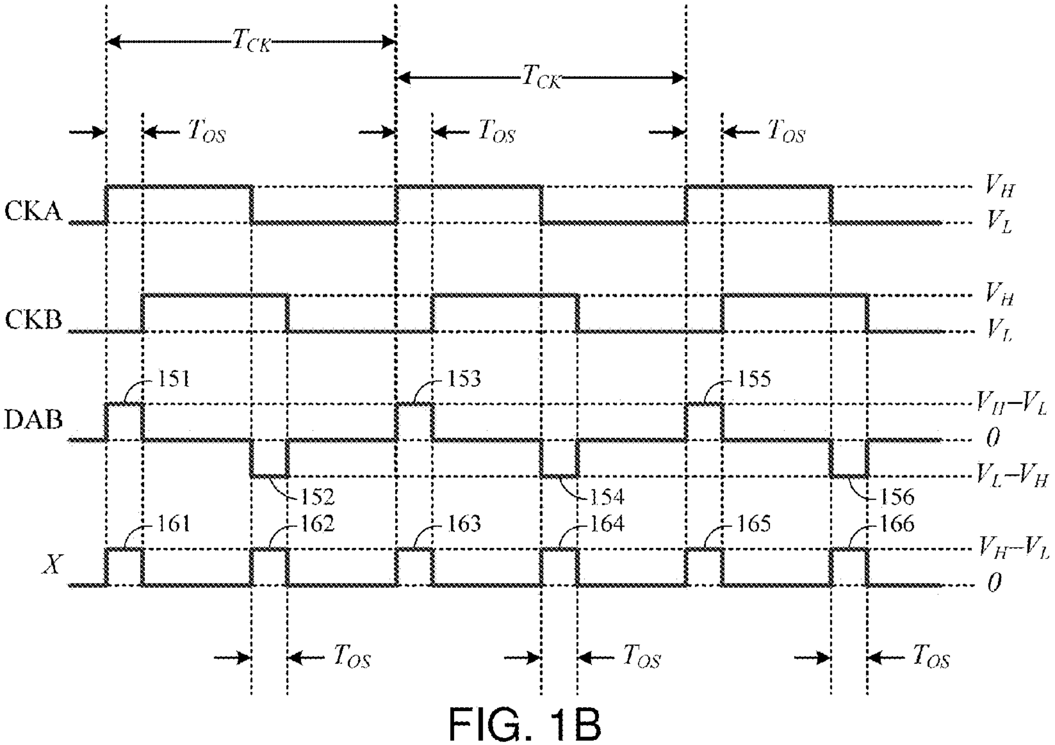
FIG. 1B shows an exemplary timing diagram of the time-to-digital converter of FIG. 1A.

A principle according to the exemplary embodiment is illustrated by an exemplary timing diagram shown in FIG. 1B. As shown, CKA is a clock of the period $T_{CK}$. CKB is the same as CKA except for the timing offset $T_{OS}$. Here, $V_H$ and $V_L$ are the voltage levels when the clock (either CKA or CKB) is high and low, respectively. DAB is a difference between CKA and CKB, i.e. DAB=CKA−CKB. Due to the timing offset between CKA and CKB, DAB is impulsive in nature and includes a sequence of pulses alternating between a positive pulse (e.g. 151, 153, 155) and a negative pulse (e.g. 152, 154, 156), wherein each pulse, positive or negative, is of width $T_{OS}$ and height $V_H-V_L$. An aspect according to the exemplary embodiment is to perform a rectification on DAB, resulting in the rectified signal X, i.e. X=|DAB|=|CKA−CKB|. Due to the rectification, X is also impulsive in nature but includes only positive pulses of width $T_{OS}$ (e.g. 161, 162, . . . , 166), wherein each pulse is of width $T_{OS}$ and height $V_H-V_L$. It is clear that an average value of X is equal to $2\cdot(V_H-V_L)-T_{OS}/T_{CK}$. The average value of X, therefore, is proportional to $T_{OS}$, and thus can be used to represent $T_{OS}$. The LPF 130 effectively performs an averaging function on X so that the resultant filtered signal V is proportional to $T_{OS}$ and thus effectively represents $T_{OS}$.

Figure 2A:
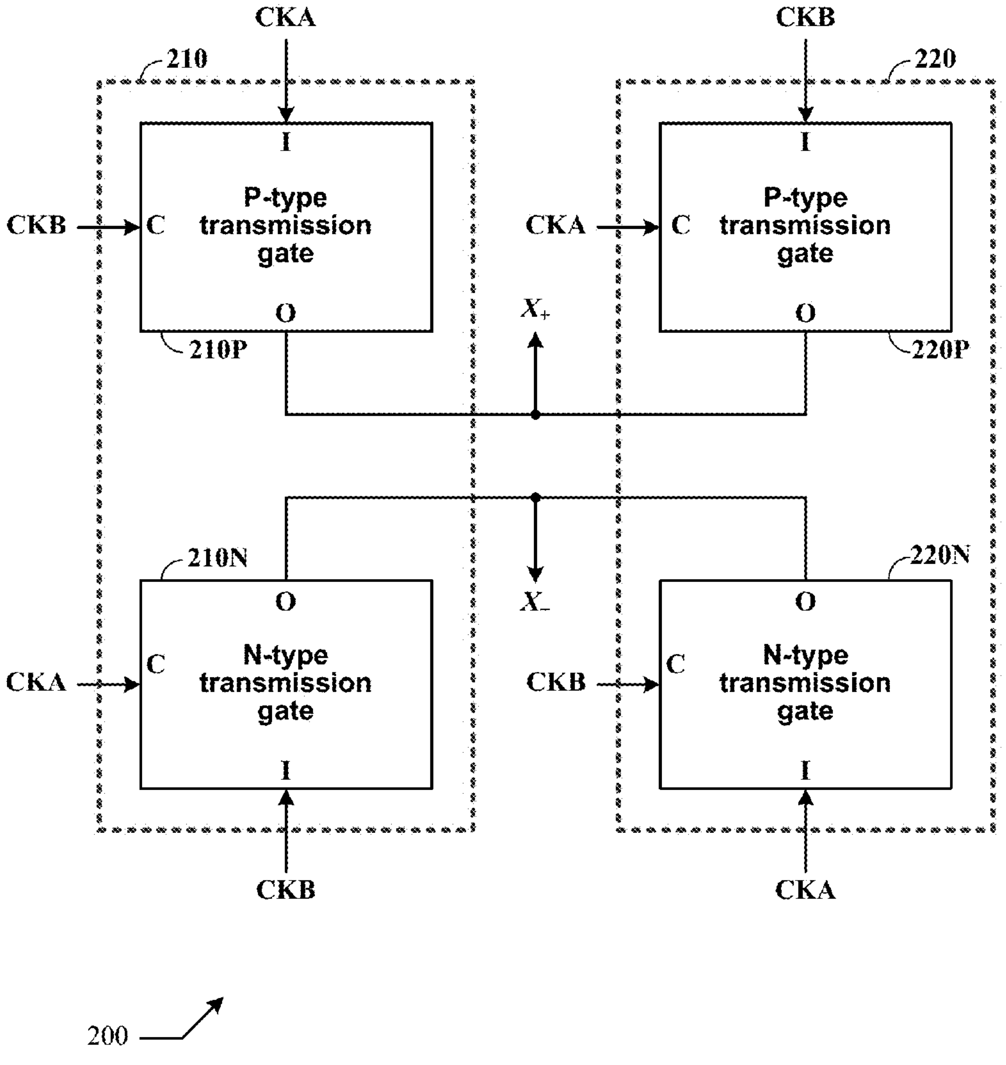
FIG. 2A shows a schematic diagram of a rectifier in accordance with the exemplary embodiment.

FIG. 2A depicts a schematic diagram of a rectifier 200 that can embody rectifier 110 of FIG. 1A in accordance with the exemplary embodiment. Here, the rectified signal X is embodied by a differential signal including a first end $X_+$ and a second end $X_-$, and the rectified signal X is equal to a difference between $X_+$ and $X_-$. "Differential signal" is a concept well understood to those of ordinary skill in the art and thus not explained in detail here. Rectifier 200 includes a first half-wave rectifier 210 and a second half-wave rectifier 220. The first half-wave rectifier 210 includes: a first P-type transmission gate 210P and a first N-type transmission gate 210N. The second half-wave rectifier 220 includes: a second P-type transmission gate 220P and a second N-type transmission gate 220N. Each of the four transmission gates (i.e., the first P-type transmission gate 210P, the second P-type transmission gate 220P, the first N-type transmission gate 210N, and the second N-type transmission gate 220N) has three terminals including an input terminal labeled as "I," an output terminal labeled as "O," and a control terminal labeled as "C." The input terminal "I," the control terminal "C," and the output terminal "O" of the first P-type (N-type) transmission gate 210P (210N) couple to CKA (CKB), CKB (CKA), and $X_+$ ($X_-$), respectively. The input terminal "I," the control terminal "C," and the output terminal "O" of the second P-type (N-type) transmission gate 220P (220N) couple to CKB (CKA), CKA (CKB), and $X_+$ ($X_-$), respectively. For a P-type transmission gate (either 210P or 220P), the signal received at its input terminal "I" is passed to its output terminal "O" when the signal at its control terminal "C" is de-asserted. For an N-type transmission gate (either 210N or 220N), the signal received at its input terminal "I" is passed to its output terminal "O" when the signal at its control terminal "C" is asserted. Therefore, when CKA is high (i.e., of a high voltage $V_H$) and CKB is low (i.e., of a low voltage $V_L$), the first P-type transmission gate 210P passes the high voltage $V_H$ to $X_+$, while the first N-type transmission gate 210N passes the low voltage $V_L$ to $X_-$, effectively transmitting a positive pulse of DAB (e.g. 151, 153, and 155 of FIG. 1B) into an odd-numbered pulse of X (e.g. 161, 163, and 165 of FIG. 1B); when CKB is high (i.e., of the high voltage $V_H$) and CKA is low (i.e., of the low voltage $V_L$), the second P-type transmission gate 220P passes the high voltage $V_H$ to $X_+$, while the second N-type transmission gate 220N passes the low voltage $V_L$ to $X_-$, effectively transmitting a negative pulse of DAB (e.g. 152, 154, and 156 of FIG. 1B) into an even-numbered pulse of X (e.g. 162, 164, and 166 of FIG. 1B). The first half-wave rectifier 210 thus performs rectification for positive pulses of DAB, while the second half-wave rectifier 220 performs rectification for negative pulses of DAB. As a whole, rectifier 200 thus performs a full-wave rectification on DAB.

Figure 2B:
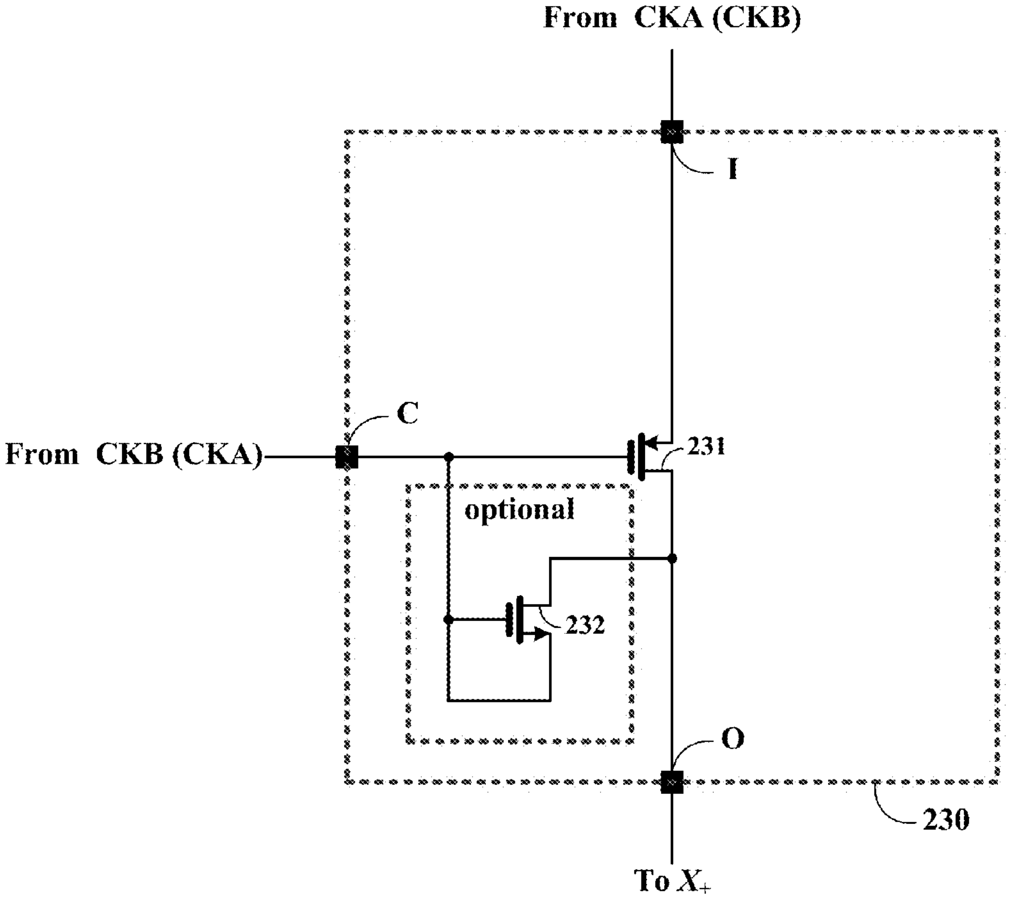
FIG. 2B shows a schematic diagram of a P-type transmission gate in accordance with the exemplary embodiment.

FIG. 2B depicts a schematic diagram of a P-type transmission gate 230 in accordance with the exemplary embodiment. The P-type transmission gate 230 is a three-terminal device including an input terminal labeled as "I," an output terminal labeled as "O," and a control terminal labeled as "C." The P-type transmission gate 230 can be used to embody the first P-type transmission gate 210P and the second P-type transmission gate 220P of FIG. 2A. When the P-type transmission gate 230 is used to embody the first (second) P-type transmission gate 210P (220P), the input terminal "I" couples to CKA (CKB), the control terminal "C" couples to CKB (CKA), and the output terminal couples to $X_+$. The P-type transmission gate 230 includes a PMOS (p-channel metal oxide semiconductor) transistor 231. The source, the gate, and the drain of the PMOS transistor 231 couple to the input terminal "I," the control terminal "C," and the output terminal "O" of the P-type-transmission gate 230, respectively. "Source," "gate," and "drain" of a PMOS transistor are well known to those of ordinary skill in the art and thus not explained in detail here. Using a PMOS transistor to embody a transmission gate is also well known to those of ordinary skill in the art and thus not described in detail here. In an optional exemplary embodiment, the P-type transmission gate 230 further includes an NMOS (n-channel metal oxide semiconductor) transistor 232. The source, the gate, and the drain of the NMOS transistor 232 couple to the control terminal "C," the control terminal "C," and the output terminal "O" of the P-type transmission gate 230, respectively. "Source," "gate," and "drain" of an NMOS transistor are well known to those of ordinary skill in the art and thus not explained in detail here. A purpose the NMOS transistor 232 is to help to make the P-type transmission gate 230 balanced. The P-type transmission gate 230 may partially pass the low voltage $V_L$ to the output terminal "O" when the signal at the input terminal "I" and the signal at the control terminal "C" are both low, thus introducing an offset to the output terminal "O." By incorporating the NMOS transistor 232, the P-type transmission gate 230 may also partially pass the high voltage $V_H$ to the output terminal "O" when the signal at the control terminal "C" is high, thus compensating the offset to the output terminal "O." Note that the rectification function of the rectifier 200 of FIG. 2A still remains in the presence of the offset, but compensating the offset improves an accuracy of the rectifier 200 and is thus useful.

Figure 2C:
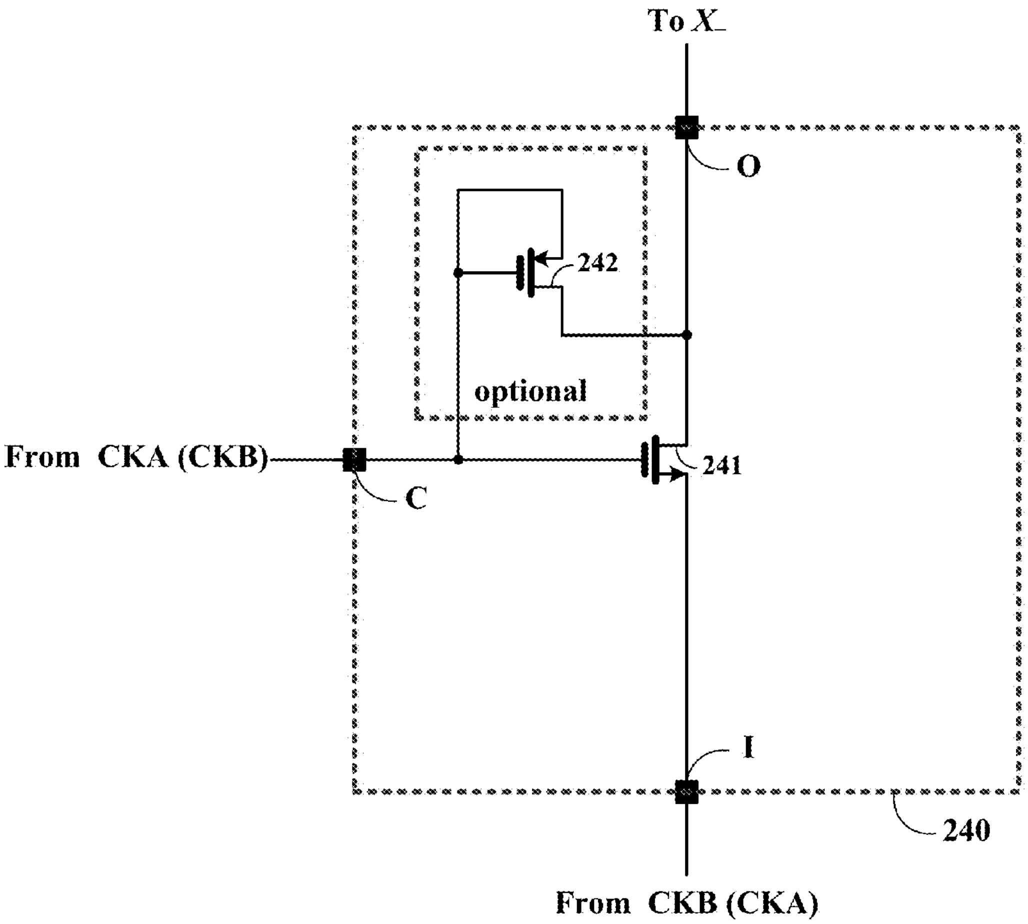
FIG. 2C shows a schematic diagram of an N-type transmission gate in accordance with the exemplary embodiment.

FIG. 2C depicts a schematic diagram of an N-type transmission gate 240 in accordance with the exemplary embodiment. The N-type transmission gate 240 is a three-terminal device including an input terminal labeled as "I," an output terminal labeled as "O," and a control terminal labeled as "C." The N-type transmission gate 240 can be used to embody the first N-type transmission gate 210N and the second N-type transmission gate 220N of FIG. 2A. When the N-type transmission gate 240 is used to embody the first (second) N-type transmission gate 210N (220N), the input terminal "I" couples to CKB (CKA), the control terminal "C" couples to CKA (CKB), and the output terminal couples to $X_-$. The N-type transmission gate 240 includes an NMOS transistor 241. The source, the gate, and the drain of the NMOS transistor 241 couple to the input terminal "I," the control terminal "C," and the output terminal "O" of the N-type-transmission gate 240, respectively. Using an NMOS transistor to embody a transmission gate is also well known to those of ordinary skill in the art and thus not described in detail here. In an optional exemplary embodiment, the N-type transmission gate 240 further includes a PMOS transistor 242. The source, the gate, and the drain of the PMOS transistor 242 couple to the control terminal "C," the control terminal "C," and the output terminal "O" of the N-type transmission gate 240, respectively. A purpose the PMOS transistor 242 is to help to make the N-type transmission gate 240 balanced. The N-type transmission gate 240 may partially pass the high voltage $V_H$ to the output terminal "O" when the signal at the input terminal "I" and the signal at the control terminal "C" are both high, thus introducing an offset to the output terminal "O." By incorporating the PMOS transistor 242, the N-type transmission gate 240 may also partially pass the low voltage $V_L$ to the output terminal "O" when the signal at the control terminal "C" is low, thus compensating the offset to the output terminal "O." Note that the rectification function of the rectifier 200 of FIG. 2A still remains in the presence of the offset, but compensating the offset improves an accuracy of the rectifier 200 and is thus useful.

Referring back to FIG. 2A. The second half-wave rectifier 220 is the same as the first half-wave rectifier 210 except that the roles of CKA and CKB are swapped. Due to using a combination of the first half-wave rectifier 210 and the second half-wave rectifier 220, rectifier 200 performs a full-wave rectification, wherein positive pulses of DAB (i.e. when CKA is high and CKB is low) are rectified by the first half-wave rectifier 210 and negative pulses of DAB (i.e. when CKA is low and CKB is high) are rectified by the second half-wave rectifier 220. As far as the time-to-digital converter 100 of FIG. 1A is concerned, however, rectifier 110 can be embodied by either a full-wave rectifier or a half-wave rectifier. When the rectifier 110 is embodied by a half-wave rectifier, it still works, but a gain factor is reduced by half (i.e., the average value of X is reduced to $(V_H-V_L)\cdot T_{OS}/T_{CK}$.). Having this in mind, in an optional exemplary embodiment, the first half-wave rectifier 210 is removed. In this case, a half-wave rectification is performed and only negative pulses are rectified.

In another optional exemplary embodiment, the second half-wave rectifier 220 is removed. In this case, a half-wave rectification is performed and only positive pulses are rectified.

An aspect according to the exemplary embodiment is: rectifier 200 of FIG. 2A can be an extremely fast circuit, due to using a transmission gate such that there is only one single transistor delay between the input (i.e. CKA and CKB) and the output (i.e. $X_+$ and end $X_-$). Therefore, rectifier 200 can be used to handle a very high speed clock.

Figure 3:
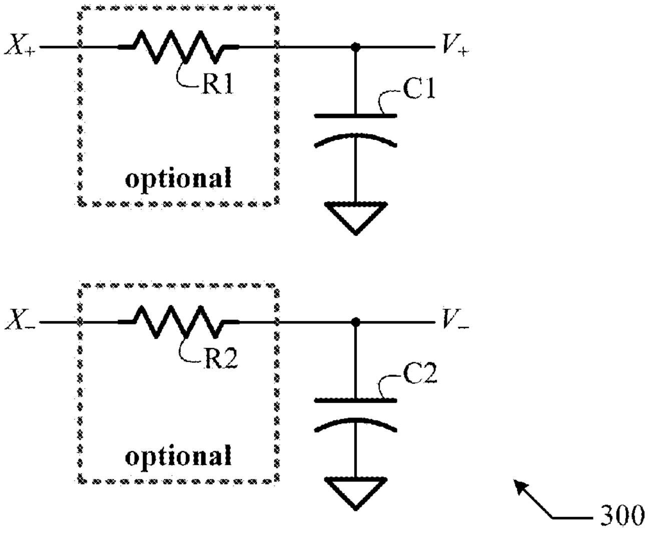
FIG. 3 shows a schematic diagram of a low-pass filter in accordance with the exemplary embodiment.

FIG. 3 depicts a schematic diagram of a low-pass filter (LPF) 300 that can embody LPF 130 of FIG. 1A in accordance with the exemplary embodiment. LPF 300 includes: a first serial resistor R1, a first shunt capacitor C1, a second serial resistor R2, and a second shunt capacitor C2. Here, the rectified signal X is embodied by a differential signal including a first end $X_+$ and a second end $X_-$, and is equal to a difference between $X_+$ and $X_-$. Likewise, the filtered signal V is embodied by a differential signal including a first end $V_+$ and a second end $V_-$, and is equal to a difference between $V_+$ and $V_-$. FIG. 3 is clear and self-explanatory to those of ordinary skill in the art and thus not explained in detail here. Also, the first serial resistor R1 and the second serial resistor R2 are optional and can be removed.

Figure 4:
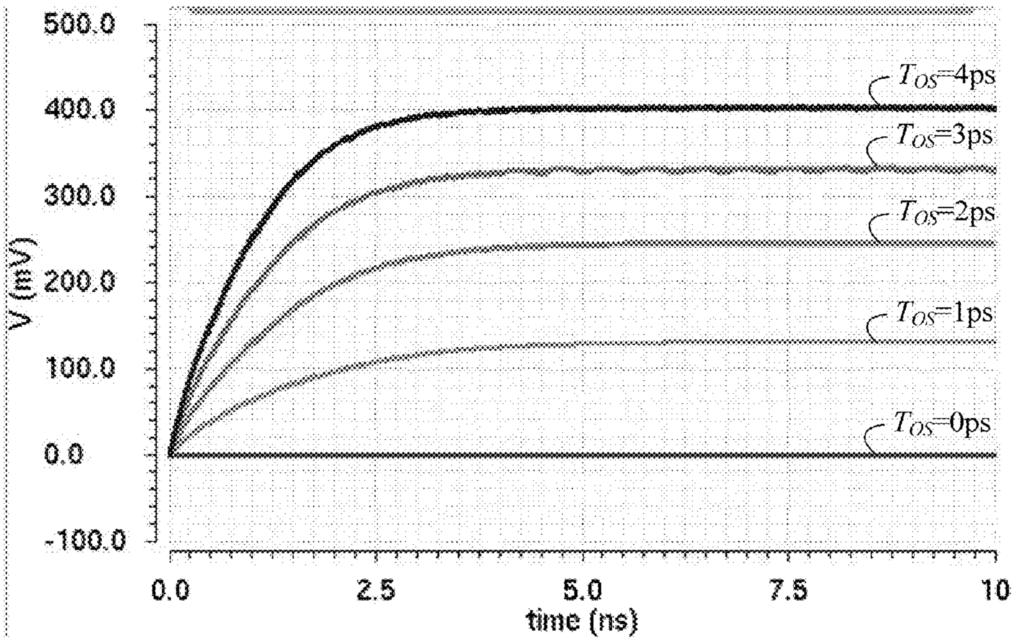
FIG. 4 shows a simulation result of a waveform of the filtered signal of the low-pass filter of FIG. 3.

A simulation result of a waveform of the filtered signal V in response to different values of the timing offset $T_{OS}$ for a 25 GHz clock is shown in FIG. 4. A 1 ps timing offset of a 25 GHz clock is very difficult to detect in the prior art, but is transformed in an exemplary embodiment to a steady voltage of roughly 130 mV that can be easily detected and converted by the subsequent analog-to-digital converter (ADC) 120 (see FIG. 1A). Analog-to-digital converters are well known in the prior art and thus not described in detail here. An aspect according to the exemplary embodiment is: due to using the low-pass filter 130 of FIG. 1A, the filtered signal Visa slowly-changing signal that can be easily handled by the subsequent analog-to-digital converter (ADC) 120.

In FIGS. 2A and 3B and FIG. 3, differential signaling is used. Note that differential signaling is a preferred but not absolutely necessary embodiment. Circuit designers may choose to use single-ended signaling at their own discretion. When using single-ended signaling, only one end of the rectified signal X (either $X_+$ or $X_-$) and one end of the filtered signal V (either $V_+$ or $V_-$) are needed, and the circuits that are used to handle the other end become irrelevant and thus can be removed. For instance, if only $X_+$ is used, the two N-type transmission gates 210N and 220N (of FIG. 2A), the second serial resistor R2, and the second shunt capacitor C2 (of FIG. 3) can be removed. If only $X_-$ is used, the two P-type transmission gates 210P and 220P (of FIG. 2A), the first serial resistor R1, and the first shunt capacitor C1 (of FIG. 3) can be removed.

Those skilled in the art will readily observe that numerous modifications and alterations of the device and method may be made while retaining the teachings of the inventive concept. Accordingly, the above disclosure should be construed as limited only by the metes and bounds of the appended claims and their equivalents.

What is claimed is:

1. A circuit comprising:

a rectifier configured to receive a first clock signal and a second clock signal and output a rectified signal, wherein the second clock signal is the same as the first clock signal except for an offset in timing;

a low-pass filter configured to receive the rectified signal and output a filtered signal; and an analog-to-digital converter configured to convert the filtered signal into a digital signal.

2. The circuit of claim 1, wherein the rectifier comprises a first half-wave rectifier comprising: a transmission gate of a first type configured to pass the first clock signal to a first end of the rectified signal in accordance with the second clock signal.

3. The circuit of claim 2, wherein the transmission gate of the first type comprises: a MOS (metal-oxide semiconductor) transistor of a first type, wherein a source, a gate, and a drain of the MOS transistor of the first type couple to the first clock signal, the second clock signal, and the first end of the rectified signal, respectively.

4. The circuit of claim 3, wherein the transmission gate of the first type further comprises: a MOS transistor of a second type, wherein a source, a gate, and a drain of the MOS transistor of the second type couple to the second clock signal, the second clock signal, and the first end of the rectified signal, respectively.

5. The circuit of claim 2, wherein the first half-wave rectifier further comprises: a transmission gate of a second type configured to pass the second clock signal to a second end of the rectified signal in accordance with the first clock signal.

6. The circuit of claim 5, wherein the transmission gate of the second type comprises: a MOS transistor of a second type, wherein a source, a gate, and a drain of the MOS transistor of the second type couple to the second clock signal, the first clock signal, and the second end of the rectified signal, respectively.

7. The circuit of claim 6, wherein the transmission gate of the second type further comprises: a MOS transistor of a first type, wherein a source, a gate, and a drain of the MOS transistor of the first type couple to the first clock signal, the first clock signal, and the second end of the rectified signal, respectively.

8. The circuit of claim 2, wherein the rectifier further comprises a second half-wave rectifier, wherein the second half-wave rectifier is the same as the first half-wave rectifier except that the roles of the first clock signal and the second clock signal are swapped.

9. The circuit of claim 1, wherein the low-pass filter comprises a shunt capacitor.

10. The circuit of claim 9, wherein the low-pass filter further comprises a serial resistor.

11. A method comprising:

receiving a first clock signal and a second clock signal, wherein the second clock signal is the same as the first clock signal except for a timing offset;

rectifying a difference between the first clock signal and the second clock signal into a rectified signal using a rectifier;

filtering the rectified signal into a filtered signal using a low-pass filter; and converting the filtered signal into a digital signal using an analog-to-digital converter.

12. The method of claim 11, wherein the rectifier comprises a first half-wave rectifier comprising: a transmission gate of a first type configured to pass the first clock signal to a first end of the rectified signal in accordance with the second clock signal.

13. The method of claim 12, wherein the transmission gate of the first type comprises: a MOS (metal-oxide semiconductor) transistor of a first type, wherein a source, a gate, and a drain of the MOS transistor of the first type couple to the first clock signal, the second clock signal, and the first end of the rectified signal, respectively.

14. The method of claim 13, wherein the transmission gate of the first type further comprises: a MOS transistor of a second type, wherein a source, a gate, and a drain of the MOS transistor of the second type couple to the second clock signal, the second clock signal, and the first end of the rectified signal, respectively.

15. The method of claim 12, wherein the first half-wave rectifier further comprises: a transmission gate of a second type configured to pass the second clock signal to a second end of the rectified signal in accordance with the first clock signal.

16. The method of claim 15, wherein the transmission gate of the second type comprises: a MOS transistor of a second type, wherein a source, a gate, and a drain of the MOS transistor of the second type couple to the second clock signal, the first clock signal, and the second end of the rectified signal, respectively.

17. The method of claim 16, wherein the transmission gate of the second type further comprises: a MOS transistor of a first type, wherein a source, a gate, and a drain of the MOS transistor of the first type couple to the first clock signal, the first clock signal, and the second end of the rectified signal, respectively.

18. The method of claim 12, wherein the rectifier further comprises a second half-wave rectifier, wherein the second half-wave rectifier is the same as the first half-wave rectifier except that the roles of the first clock signal and the second clock signal are swapped.

19. The method of claim 11, wherein the low-pass filter comprises a shunt capacitor.

20. The method of claim 19, wherein the low-pass filter further comprises a serial resistor.

* * * * *